United States Patent
Tsai et al.

(10) Patent No.: US 8,994,155 B2
(45) Date of Patent: Mar. 31, 2015

(54) PACKAGING DEVICES, METHODS OF MANUFACTURE THEREOF, AND PACKAGING METHODS

(71) Applicant: Taiwan Semiconductor Manufacturing Company, Ltd., Hsin-Chu (TW)

(72) Inventors: Tsung-Fu Tsai, Changhua County (TW); Yu-Chang Lin, Hsinchu (TW); Ying Ching Shih, Taipei (TW); Wei-Min Wu, Hsin-Chu (TW); Yian-Liang Kuo, Miaoli County (TW); Chia-Wei Tu, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 13/656,423

(22) Filed: Oct. 19, 2012

(65) Prior Publication Data
US 2014/0110836 A1    Apr. 24, 2014

(51) Int. Cl.
*H01L 21/56* (2006.01)
(52) U.S. Cl.
CPC ..................................... *H01L 21/563* (2013.01)
USPC ................... 257/667; 257/E23.125; 438/108; 438/124; 438/127

(58) Field of Classification Search
CPC ..................................................... H01L 21/563
USPC ........... 257/667, E23.116, E23.002, E23.125; 438/122, 124, 108, 127, 612
See application file for complete search history.

(56) References Cited

U.S. PATENT DOCUMENTS

| | | | |
|---|---|---|---|
| 6,653,720 B2 * | 11/2003 | Kameda | 257/667 |
| 6,939,746 B2 * | 9/2005 | Bolken | 438/127 |
| 8,343,810 B2 | 1/2013 | Oh et al. | |
| 8,441,123 B1 * | 5/2013 | Lee et al. | 257/737 |
| 8,597,982 B2 * | 12/2013 | Foote et al. | 438/107 |
| 2006/0220259 A1 * | 10/2006 | Chen et al. | 257/778 |
| 2009/0154128 A1 * | 6/2009 | Tamadate | 361/783 |
| 2011/0133321 A1 * | 6/2011 | Ihara | 257/676 |
| 2012/0013007 A1 | 1/2012 | Hwang et al. | |
| 2012/0319300 A1 * | 12/2012 | Kim et al. | 257/777 |

* cited by examiner

*Primary Examiner* — John C Ingham
(74) *Attorney, Agent, or Firm* — Slater & Matsil, L.L.P.

(57) ABSTRACT

Packaging devices, methods of manufacture thereof, and packaging methods for semiconductor devices are disclosed. In one embodiment, a packaging device includes a substrate including an integrated circuit die mounting region. An underfill material flow prevention feature is disposed around the integrated circuit die mounting region.

20 Claims, 7 Drawing Sheets

PACKAGING DEVICES, METHODS OF MANUFACTURE THEREOF, AND PACKAGING METHODS

CROSS-REFERENCE TO RELATED APPLICATIONS

This application relates to the following co-pending and commonly assigned patent application: Ser. No. 13/559,153, filed on Jul. 26, 2012, entitled, "Package-on-package Structures Having Buffer Dams and Methods for Forming the Same," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging methods for semiconductor devices. Novel packaging devices for semiconductor devices that include an underfill material flow prevention feature, methods of manufacture thereof, and packaging methods and structures for semiconductor devices will be described herein.

Figure 1:
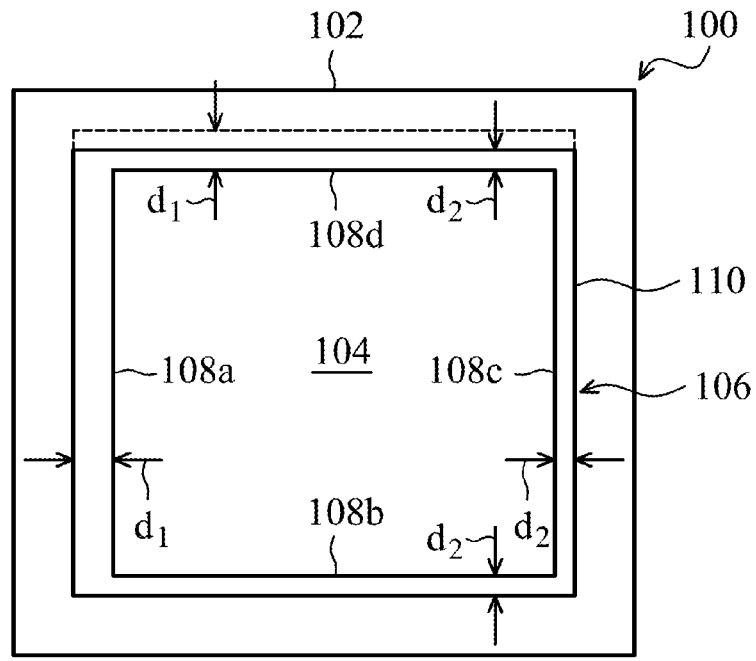
FIG. 1 shows a top view of packaging device in accordance with some embodiments of the present disclosure.

Referring first to FIG. 1, there is shown a top view of packaging device 100 in accordance with some embodiments of the present disclosure. The packaging device 100 includes a substrate 102. The substrate 102 comprises a semiconductor wafer in some embodiments and may be covered by an insulating layer, for example. The substrate 102 may or may not include active components or circuits formed thereon, not shown. The substrate 102 may comprise silicon oxide over single-crystal silicon, for example. The substrate 102 may include other conductive layers or other semiconductor elements, e.g., transistors, diodes, etc. Compound semiconductors, GaAs, InP, Si/Ge, or SiC, as examples, may be used in place of silicon. The substrate 102 may comprise a silicon-on-insulator (SOI) or a germanium-on-insulator (GOI) substrate, as examples. In some embodiments, the substrate 102 comprises an interposer substrate, as another example. Alternatively, the substrate 102 may comprise other materials and types of substrates.

Note that in the drawings of the present disclosure, only one substrate 102 is shown; however, a plurality of substrates 102 are disposed across a surface of a wafer or other material, and later the substrates 102 are singulated.

The substrate 102 comprises a wafer level packaging (WLP) substrate in some embodiments, as examples. Alternatively, other types of substrates 102 may be used.

The substrate 102 includes an integrated circuit die mounting region 104 where an integrated circuit die 120 (not shown in FIG. 1; see FIG. 5) will later be mounted. The integrated circuit die mounting region 104 may be disposed in a central region of the substrate 102 in some embodiments. Alternatively, the integrated circuit die mounting region 104 may be disposed on a corner or other location of the substrate 102, not shown.

The substrate 102 includes an underfill material flow prevention feature 106 disposed around the integrated circuit die mounting region 104. The novel underfill material flow prevention feature 106 comprises at least one ring 110 disposed around the integrated circuit die mounting region 104. In FIG. 1, the underfill material flow prevention feature 106 comprises a single ring 110 disposed around a perimeter of the integrated circuit die mounting region 104. The ring 110 comprises a single raised feature and is a continuous ring of material around the perimeter of the integrated circuit die mounting region 104.

The underfill material flow prevention feature 106 is disposed away from (e.g., spaced apart from) a first side 108a of the integrated circuit die mounting region 104 by a first dimension $d_1$. The underfill material flow prevention feature 106 is disposed away from a second side 108b of the integrated circuit die mounting region 104 by a second dimension $d_2$. In some embodiments, the second dimension $d_2$ is less than the first dimension $d_1$. Alternatively, the second dimension $d_2$ may be substantially the same as the first dimension $d_1$, or greater than the first dimension $d_1$. The underfill material flow prevention feature 106 is also disposed away from a third side 108c and a fourth side 108d of the integrated circuit die mounting region 104 by the second dimension $d_2$ in some embodiments.

The first dimension $d_1$ comprises about 800 μm or less, and the second dimension $d_2$ comprises about 400 μm or less, in some embodiments. Alternatively, the first and second dimensions $d_1$ and $d_2$ may comprise other values.

An underfill material 124 (see FIG. 9) is later dispensed along the first side 108a of the integrated circuit die mounting region 104 in some embodiments, and thus, the first dimension $d_1$ is greater than the second dimension $d_2$ to accommodate for the diameter of a dispensing needle (see FIG. 9) of the underfill material 124. In some embodiments, the underfill material 124 is dispensed along two sides, and the underfill material flow prevention feature 106 is spaced apart from a second side (e.g., the fourth side 108d in FIG. 1) by dimension $d_2$ to accommodate for the dispensing of the underfill material 124 along the additional side 108d, as shown in phantom in FIG. 1.

Figure 2:
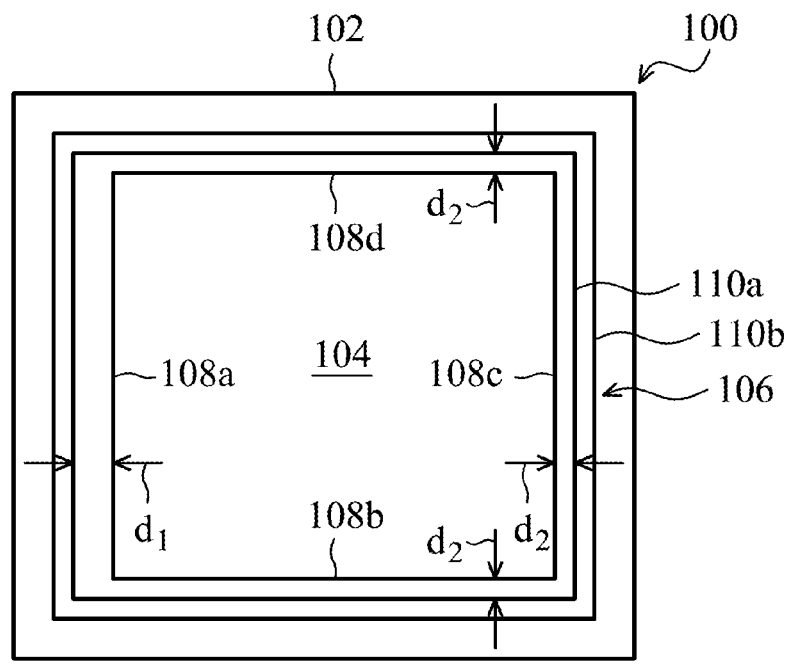
FIG. 2 is a top view of packaging device in accordance with other embodiments.
Figure 3:
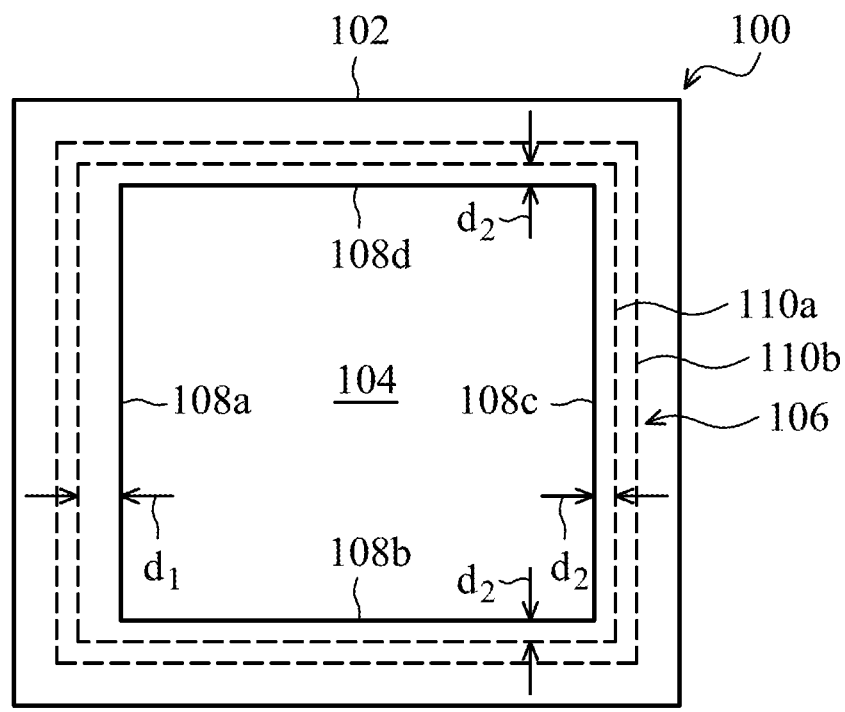
FIG. 3 is a top view of packaging device in accordance with other embodiments.
Figure 4:
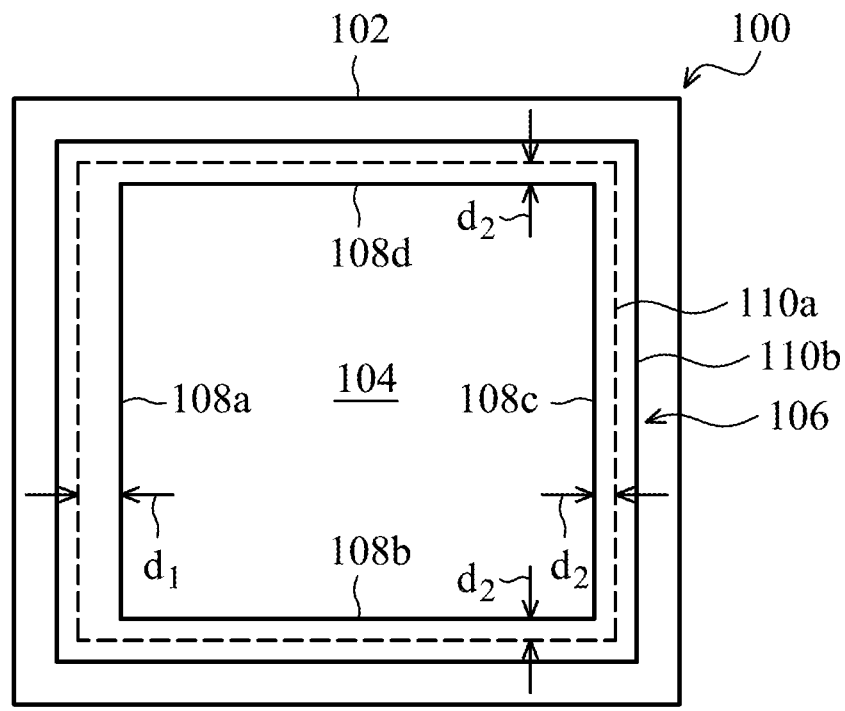
FIG. 4 is a top view of packaging device in accordance with other embodiments.

FIGS. 2 through 4 illustrate top views of packaging devices 100 in accordance with other embodiments, showing some various shapes of the underfill material flow prevention feature 106. In FIG. 2, the underfill material flow prevention feature 106 comprises two concentric rings 110a and 110b of material disposed around the integrated circuit die mounting region 104. Alternatively, three or more rings of material may also be included, not shown. An underfill material flow prevention feature 106 including two or more rings 110a and 110b of material is advantageous because if the central-most inner ring 110a does not completely stop the flow of the underfill material 124, the outer ring 110b can capture the overflow and prevent the flow of the underfill material 124 from flowing outwardly past the outer ring 110b, for example. The two rings 110a and 110b of material are both continuous in the embodiments illustrated in FIG. 2.

Alternatively, one or more of the rings 110a and 110b of material may be discontinuous (e.g., the rings 110a and/or 110b are not continuous), as illustrated in FIG. 3, which illustrates an embodiment wherein both rings 110a and 110b of material are discontinuous. The breaks or discontinuities in the rings 110a and 110b are staggered from ring 110a to ring 110b, to prevent the flow of the underfill material 124 past the outer ring 110b in some embodiments, for example. One ring 110a may be discontinuous and the other ring 110b may be continuous in other embodiments, as illustrated in FIG. 4, wherein the outer ring 110b is continuous.

In embodiments wherein the underfill material flow prevention feature 106 comprises two or more rings 110, 110a, and 110b or wherein the rings 110a or 110b are discontinuous, the underfill material flow prevention feature 106 comprises a plurality of raised features of the substrate 102, for example.

Figure 5:
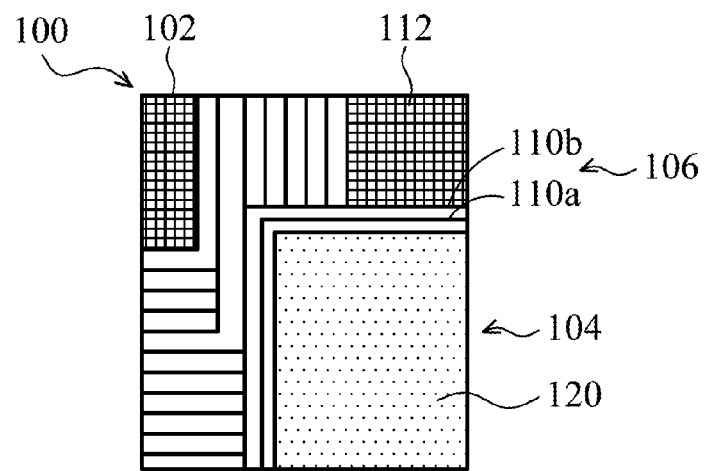
FIG. 5 is a top view of a portion of a packaging device in accordance with some embodiments.

FIG. 5 is a top view of a portion of a packaging device 100 in accordance with some embodiments. An integrated circuit die 120 is illustrated mounted to the integrated circuit die mounting region 104 of the substrate 102. A plurality of patterns 112 are shown on a top surface of the substrate 102. The patterns 112 may comprise conductive material such as Cu, Al, other materials, multiple layers or alloys thereof, and may include conductive lines or contact pads in some embodiments, as an example. The patterns 112 may comprise dummy patterns in some embodiments that are included in the structure of the substrate 102 for various reasons, such as to improve thermal properties of the substrate, coefficient of thermal expansion properties, chemical-mechanical polishing (CMP) planarity, or electroplating uniformity, as examples. Advantageously, in some embodiments, the novel underfill material flow prevention feature 106 is included in the same material layer that the patterns 112 are formed in, for example, avoiding the requirement for an additional material layer and lithography process.

Figure 6:
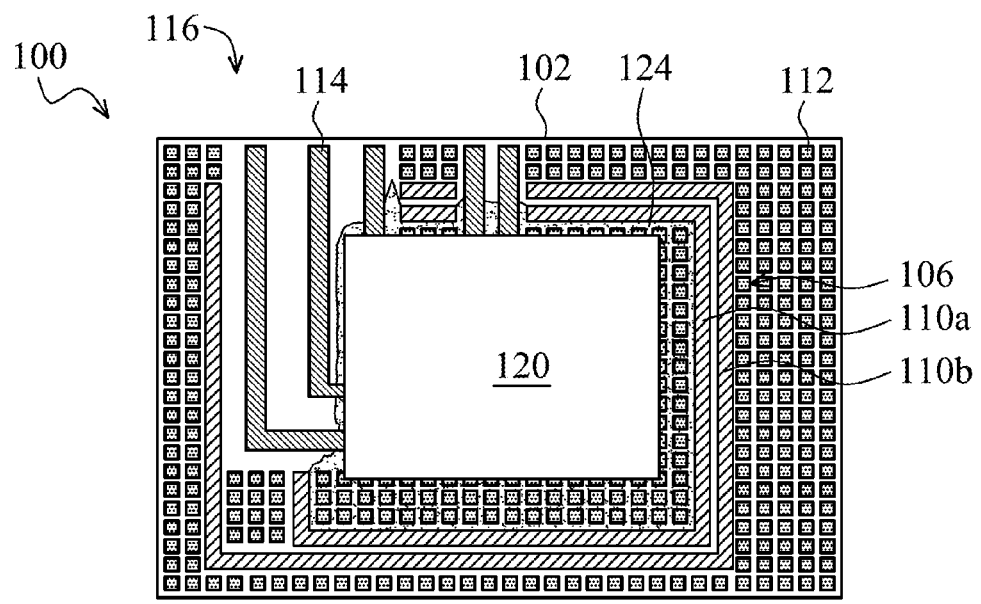
FIG. 6 is a top view of a portion of a packaging device in accordance with other embodiments.

FIG. 6 is a top view of a portion of a packaging device 100 in accordance with other embodiments. Both rings 110a and 110b are discontinuous to accommodate for traces 114 of conductive material disposed over the substrate 102. The traces 114 may comprise conductive lines in a top layer of a redistribution layer (RDL) 116 of the packaging device 100, for example. Because the rings 110a and 110b of the underfill material flow prevention feature 106 are conductive in some embodiments, in order to avoid shorting the traces 114 of conductive material, the rings 110a and 110b are discontinuous proximate the traces 114 and are not coupled to the traces 114. The underfill material 124 is prevented or deterred from flowing past the rings 110a and 110b of the underfill material flow prevention feature 106 by the rings 110a and 110b and also portions of the traces 114 of the RDL 116.

Figure 7:
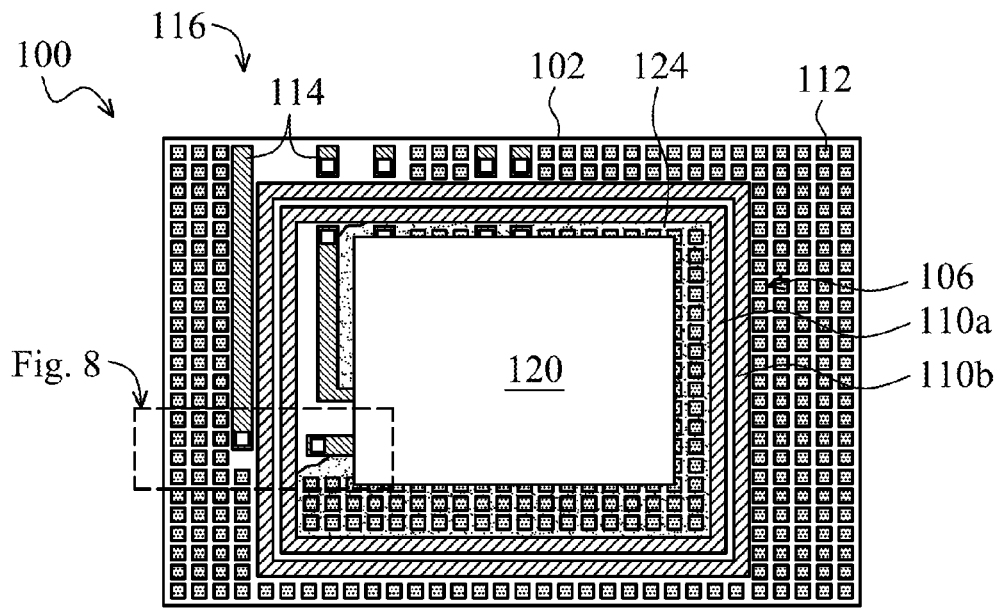
FIG. 7 is a top view of a portion of a packaging device in accordance with yet other embodiments.
Figure 8:
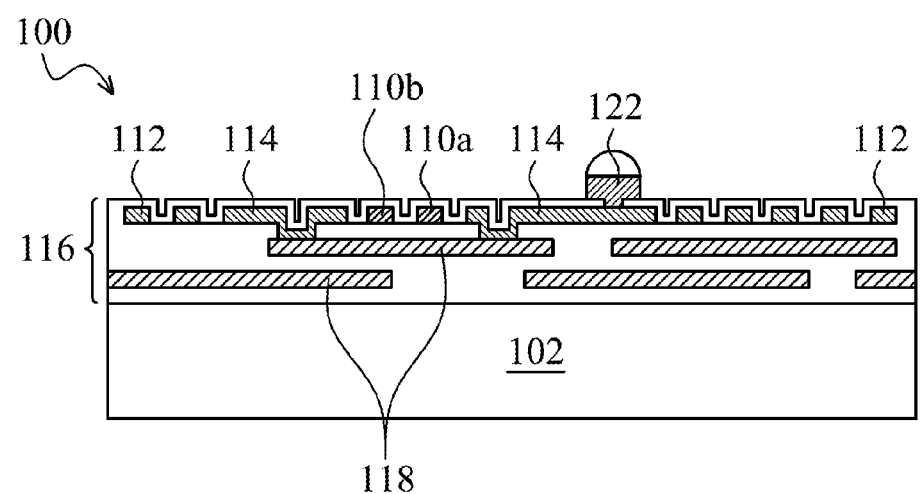
FIG. 8 is a cross-sectional view of a portion of the packaging device shown in FIG. 7.

In other embodiments, the RDL 116 is modified so the underfill material flow prevention feature 106 may comprise continuous rings 110a and 110b, as shown in FIG. 7, which is a top view of a portion of a packaging device 100 in accordance with other embodiments. FIG. 8 is a cross-sectional view of a portion of the packaging device 100 shown in FIG. 7, illustrating the RDL 116 wherein traces 114 are coupled to conductive segments 118 in lower levels of the RDL 116. The traces 114 and conductive segments 118 are formed in one or more insulating material layers of the RDL 116. Some of the traces 114 include portions that comprise an underball metallization (UBM) structure where conductive bumps 122 are later attached.

Figure 9:
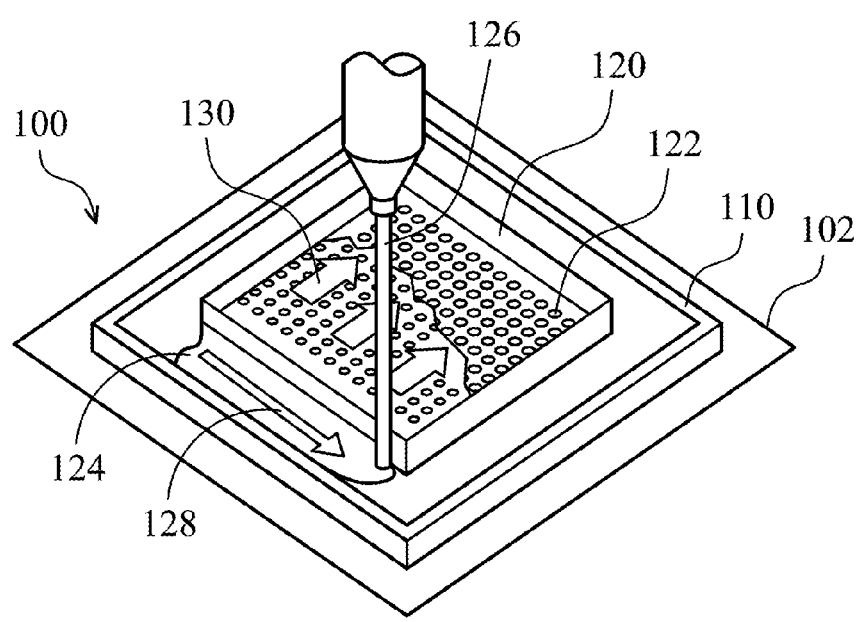
FIG. 9 is a perspective view of an underfill material being applied under an integrated circuit die mounted on a packaging device in accordance with some embodiments.

FIG. 9 is a perspective view of an underfill material 124 being applied under an integrated circuit die 120 mounted on a packaging device 100 in accordance with some embodiments. The integrated circuit die 120 is attached to the substrate 102 by a plurality of conductive bumps 122. The conductive bumps 122 may be arranged in an array, a random pattern, or other patterns on the bottom surface of the integrated circuit die 120. The conductive bumps 122 may comprise solder balls, controlled collapse chip connection (C4) bumps, or other types of connections, as examples. The conductive bumps 122 are attached to contacts (not shown) or UBM structures on the integrated circuit die mounting region 104 of the substrate 102 using a solder reflow process, for examples. The underfill material 124 is applied after the integrated circuit die 120 is coupled to the substrate 102.

A dispensing needle 126 is used to dispense the underfill material 124 along one or more sides of the integrated circuit die 120. The path of the dispensing needle 126 during the dispensing process is shown at 128. The underfill material 124 is a liquid when applied that flows beneath the integrated circuit die 120 between the conductive bumps 122 along a width of the integrated circuit die 120 to an opposite side of the integrated circuit die 120 from the needle 126. The path of the liquid underfill material 124 is shown at 130. The liquid underfill material 124 flows under the integrated circuit die 120 due to capillary action, for example. The underfill material 124 may comprise epoxy or a polymer, although other materials may alternatively be used. The underfill material 124 comprises a solid when hardened, after curing. The underfill material flow prevention feature 106 comprises a single ring 110 of material in the example shown in FIG. 6. The underfill material flow prevention feature 106 prevents the underfill material 124 from flowing outside the ring 110.

Figure 10:
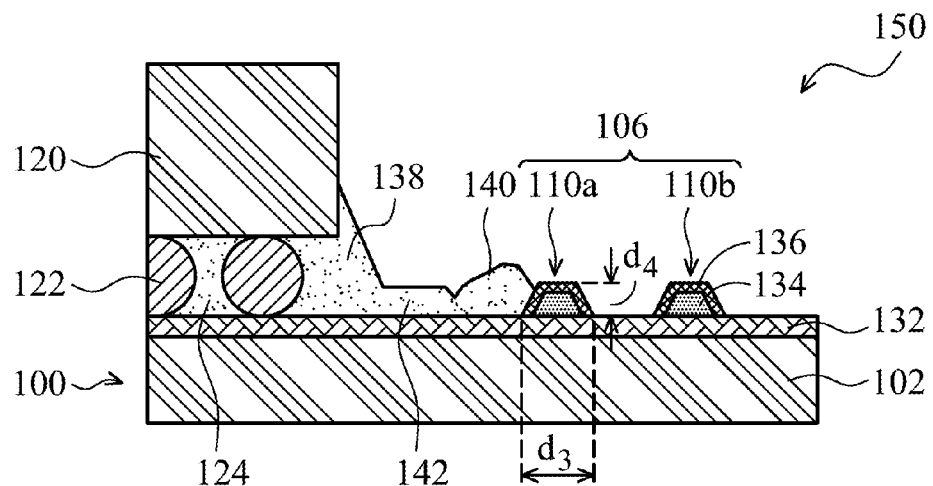
FIG. 10 is a cross-sectional view of a portion of an integrated circuit die mounted on a packaging device in accordance with some embodiments.

FIG. 10 is a cross-sectional view of a portion of an integrated circuit die 120 mounted on a packaging device 100, illustrating a packaged semiconductor device 150 in accordance with some embodiments. A more detailed view of the underfill material 124 after curing is shown. When the underfill material 124 is applied, fillets 138 are formed along the sides of the integrated circuit die 120 due to a meniscus effect of the liquid during and after the dispensing and curing processes of the underfill material 124. The fillets 138 may have a concave shape on a top surface thereof after curing, for example (not shown). The underfill material flow prevention feature 106 functions as a dam and prevents or reduces underfill material 124 outward dispreading. A raised region 140 of the underfill material 124 may form proximate the underfill material flow prevention feature 106. Other portions 142 of the underfill material 124 may have a decreased thickness than the raised region 140. In some embodiments, a raised region 140 is not formed, not shown. In other embodiments, portions 142 of the underfill material 124 do not extend completely to the inner ring 110a, and a top surface of the substrate 102 is exposed proximate the inner ring 110a, as another example, also not shown.

The cross-sectional view in FIG. 10 also illustrates the shape and dimensions of the rings 110a and 110b of the underfill material flow prevention feature 106. The rings 110a and 110b of material may comprise a trapezoidal shape in the cross-sectional view, having a greater width proximate the substrate 102 than at the top. The rings 110a and 110b may alternatively be square, rectangular, or other shapes. The rings 110a and 110b of the underfill material flow prevention feature 106 each comprise a width in a cross-sectional view along a side comprising dimension $d_3$, wherein dimension $d_3$ comprises about 5 μm or less. The rings 110a and 110b of the underfill material flow prevention feature 106 each comprise a height comprising dimension $d_4$ above a top surface of the substrate 102, wherein dimension $d_4$ comprises about 5 μm or less. Alternatively, dimensions $d_3$ and $d_4$ may comprise other values.

The underfill material flow prevention feature 106 comprises a metal in some embodiments. The underfill material flow prevention feature 106 may comprise a metal, an insulator, epoxy, a polymer, or multiple layers or combinations thereof in some embodiments, as examples. The rings 110a and 110b may comprise a first layer 134 and a second layer 136 disposed over the first layer 134. The first layer 134 may comprise a metal or other conductive material, and the second layer 136 may comprise an insulator such as silicon dioxide, silicon nitride, other insulators, or multiple layers or combinations thereof, as examples. Alternatively, the first layer 134 and the second layer 136 may comprise other materials, and the rings 110a and 110b may comprise a single material layer or three or more material layers, as examples.

The underfill material flow prevention feature 106 may be formed by patterning a material layer of the substrate 102 or by adding material to the substrate 102. For example, the rings 110a and 110b of the underfill material flow prevention feature 106 may be formed by adding a layer of material to the top surface of the substrate 102, and patterning the layer of material using lithography to form the rings 110a and 110b. Alternatively, the rings 110a and 110b may be formed by plating. In some embodiments, the rings 110a and 110b are formed in an existing material layer of the substrate 102, so that an additional material layer is not required, as described with reference to FIG. 5. The rings 110a and 110b may be formed in the same material layer that features 112 and/or traces 114 are formed in, for example.

Also illustrated in FIG. 10 is an insulating material layer 132 that may be formed at a top surface of the substrate 102. Other material layers may also or may alternatively be formed proximate the top surface of the substrate 102. For example, an RDL 116 (not shown in FIG. 10; see FIG. 8) may be formed at the top surface of the substrate 102 that may include fan-out wiring for connections from the integrated circuit die 120 to contact pads of the RDL 116. An RDL 116 may also or may alternatively be formed at the bottom surface of the substrate 102, not shown. In some embodiments, the substrate 102 does not include an RDL 116 or an insulating material layer 132.

Figure 11:
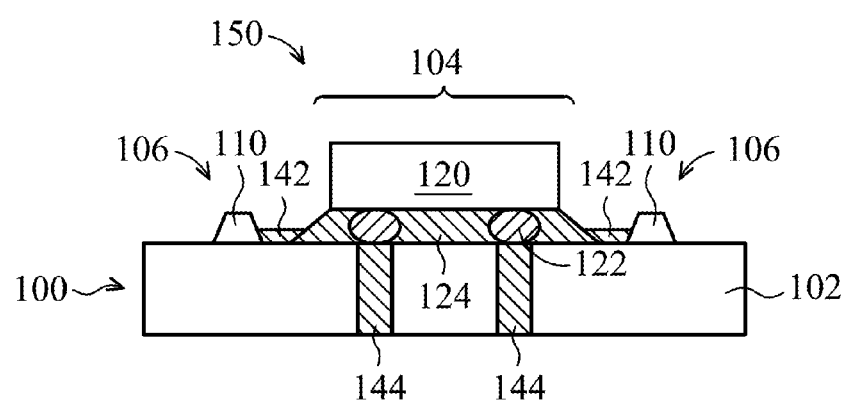
FIG. 11 is a cross-sectional view of a packaged semiconductor device in accordance with some embodiments.

FIG. 11 is a cross-sectional view of a packaged semiconductor device 150 in accordance with some embodiments. The substrate 102 includes a plurality of through-substrate vias (TSVs) 144 in some embodiments. In some embodiments, the TSVs 144 are not included. In some embodiments, the substrate 102 comprises a portion of a wafer, and mounting the integrated circuit die 120 onto the integrated circuit die mounting region 104 of the substrate 102 comprises a chip-on wafer (COW) process. Other types of processes may also be used.

Figure 12:
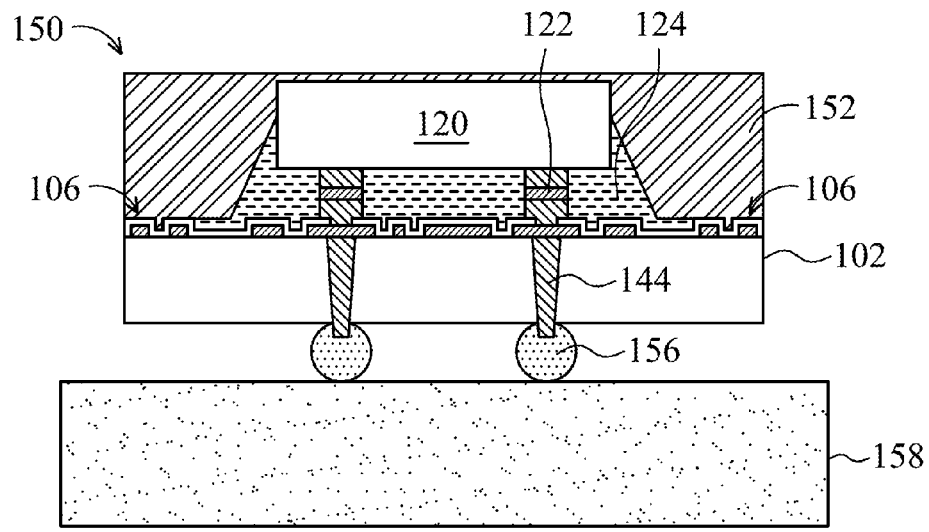
FIG. 12 is a cross-sectional view of a packaged semiconductor device in accordance with other embodiments.

In some embodiments, after the manufacturing process for the packaged semiconductor device 150 shown in FIG. 11, a molding compound 152 is formed over the integrated circuit die 120, the underfill material flow prevention feature 106, the underfill material 124, and exposed portions of the substrate 102, as shown in FIG. 12, which is a cross-sectional view of a packaged semiconductor device 150 that includes a packaging substrate 102 described herein in accordance with some embodiments. The packaged semiconductor device 150 may be packaged with a printed circuit board (PCB) substrate 158 in accordance with some embodiments. The PCB substrate 158 is also referred to herein, e.g., in some of the claims, as a second substrate. For example, solder balls 156 may be coupled to the TSVs 144 on the bottom of the substrate 102, and the solder balls 156 may be coupled to contacts on the PCB substrate 158 using a chip-on wafer-on-substrate (CO-WOS) process, for example. The novel packaged semiconductor devices 150 including the substrate 102 with the underfill material flow prevention feature 106 can also be utilized and implemented in other applications and packaging configurations.

Figure 13:
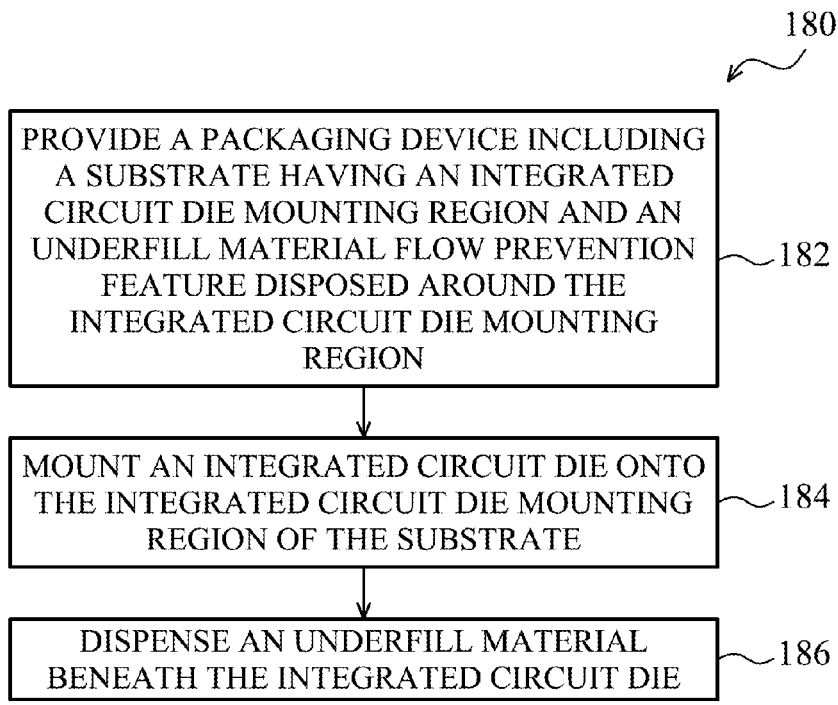
FIG. 13 is a flow chart of a method of packaging a semiconductor device in accordance with some embodiments.

FIG. 13 is a flow chart 180 of a method of packaging a semiconductor device in accordance with some embodiments. In step 182, a packaging device 100 is provided that includes a substrate 102 including an integrated circuit die mounting region 104 and an underfill material flow prevention feature 106 disposed around the integrated circuit die mounting region 104. In step 184, an integrated circuit die 120 is mounted onto the integrated circuit die mounting region 104 of the substrate 102. In step 186, an underfill material 124 is dispensed beneath the integrated circuit die 120. The underfill material flow prevention feature 106 prevents the underfill material 124 from flowing past the underfill material flow prevention feature 106 on the packaging device 100.

Some embodiments of the present disclosure include methods of manufacturing the packaging devices 100 described herein, and also include packaging devices 100 that include the novel underfill material flow prevention features 106. Some embodiments of the present disclosure also include packaged semiconductor devices 150 that have been packaged using the novel packaging devices 100 described herein.

Advantages of some embodiments of the disclosure include providing novel packaging devices 100 that include the underfill material flow prevention features 106 described herein. The rings 110, 110a, and 110b of the underfill material flow prevention features 106 reduce or prevent underfill material 124 outward dispreading, resulting in improved packaged devices 150. Reducing or preventing the outward flow of the underfill material 124 from beneath the integrated circuit dies 120 advantageously results in the prevention of or decreased delamination of the underfill material 124 and also results in the prevention of or decreased delamination of a subsequently deposited molding compound in some applications, for example. Improved adhesion of the underfill material 124 and also the subsequently deposited molding compound to the substrate 102 is achieved, and there is decreased risk of bulging of the packaged semiconductor devices 150, due to the improved adhesion. The underfill material flow prevention features 106 comprise dummy pattern designs that reduce the area of dispreading underfill material 124 outside the perimeter of the integrated circuit dies 120. The novel underfill material flow prevention features 106 are implementable at no additional costs in manufacturing process flows. The novel underfill material flow prevention feature 106 structures and designs are easily implementable in manufacturing process flows for packaging devices.

In accordance with some embodiments of the present disclosure, a packaging device includes a substrate including an integrated circuit die mounting region. An underfill material flow prevention feature is disposed around the integrated circuit die mounting region.

In accordance with other embodiments, a method of manufacturing a packaging device includes providing a substrate, the substrate including an integrated circuit die mounting region. An underfill material flow prevention feature is formed on the substrate around a perimeter of the integrated circuit die mounting region. The underfill material flow prevention feature is adapted to prevent an underfill material disposed beneath an integrated circuit die disposed on the integrated circuit die mounting region from flowing past the underfill material flow prevention feature.

In accordance with other embodiments, a method of packaging a semiconductor device includes providing a packaging device, the packaging device comprising a substrate including an integrated circuit die mounting region and an underfill material flow prevention feature disposed around the integrated circuit die mounting region. The method includes mounting an integrated circuit die onto the integrated circuit die mounting region of the substrate, and dispensing an underfill material beneath the integrated circuit die. The underfill material flow prevention feature prevents the underfill material from flowing past the underfill material flow prevention feature on the packaging device.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging device, comprising:
   a substrate including an integrated circuit die mounting region;
   a redistribution layer disposed over the substrate, the redistribution layer comprising an insulating layer formed over the substrate and having a surface in direct physical contact with the substrate, the redistribution layer further comprising at least one conductive trace formed in the insulating layer; and
   an underfill material flow prevention feature disposed around the integrated circuit die mounting region and formed in the insulating layer of the redistribution layer.

2. The packaging device according to claim 1, wherein the underfill material flow prevention feature comprises a plurality of raised features disposed around a perimeter of the integrated circuit die mounting region.

3. The packaging device according to claim 1, wherein the underfill material flow prevention feature comprises a single raised feature disposed around a perimeter of the integrated circuit die mounting region.

4. The packaging device according to claim 1, wherein the underfill material flow prevention feature comprises a width in a cross-sectional view of about 5 μm or less.

5. The packaging device according to claim 1, wherein the underfill material flow prevention feature comprises a height above a top surface of the substrate of about 5 μm or less.

6. The packaging device according to claim 1, wherein the underfill material flow prevention feature comprises a material consisting essentially of a metal, an insulator, epoxy, a polymer, and combinations thereof.

7. The packaging device according to claim 1, wherein the underfill material flow prevention feature is disposed away from a first side of the integrated circuit die mounting region by a first dimension, and wherein the underfill material flow prevention feature is disposed away from a second side of the integrated circuit die mounting region by a second dimension.

8. The packaging device according to claim 7, wherein the second dimension is less than the first dimension.

9. The packaging device according to claim 7, wherein the first dimension comprises about 800 μm or less, and wherein the second dimension comprises about 400 μm or less.

10. A method of manufacturing a packaging device, the method comprising:
    providing a substrate, the substrate including an integrated circuit die mounting region; and
    forming an underfill material flow prevention feature comprising a plurality of material layers on the substrate around a perimeter of the integrated circuit die mounting region, wherein the underfill material flow prevention feature is adapted to prevent an underfill material disposed beneath an integrated circuit die disposed on the integrated circuit die mounting region from flowing past the underfill material flow prevention feature, and wherein the plurality of material layers of the underfill material flow prevention feature comprises a conductive layer and a non-conductive layer covering surfaces of the conductive layer facing away from the substrate.

11. The method according to claim 10, wherein forming the underfill material flow prevention feature comprises patterning a material layer of the substrate.

12. The method according to claim 10, wherein forming the underfill material flow prevention feature comprises adding material to the substrate.

13. The method according to claim 10, wherein forming the underfill material flow prevention feature comprises forming a ring of material around the integrated circuit die mounting region.

14. The method according to claim 13, wherein forming the ring of material comprises forming a continuous ring of material.

15. The method according to claim 13, wherein forming the ring of material comprises forming a discontinuous ring of material.

16. The method according to claim 10, wherein forming the underfill material flow prevention feature comprises forming a plurality of concentric rings of material around the integrated circuit die mounting region.

17. The method according to claim 10, wherein providing the substrate comprises providing a wafer level packaging (WLP) substrate.

18. A method of packaging a semiconductor device, the method comprising:
    providing a packaging device, the packaging device comprising a substrate including an integrated circuit die mounting region and an underfill material flow prevention feature disposed around the integrated circuit die mounting region, wherein the underfill material flow prevention feature comprises a first feature disposed along a first side of the integrated circuit die mounting region and a second feature disposed along the first side of the integrated circuit die mounting region and adjacent to the first feature on a side of the first feature facing away from the integrated circuit die mounting region, wherein at least one of the first feature and the second feature comprises discontinuous segments, and wherein the discontinuous segments comprise a conductive layer and a non-conductive layer covering surfaces of the conductive layer facing away from the substrate;
    mounting an integrated circuit die onto the integrated circuit die mounting region of the substrate; and
    dispensing an underfill material beneath the integrated circuit die, wherein the underfill material flow prevention feature prevents the underfill material from flowing past the underfill material flow prevention feature on the packaging device.

19. The method according to claim 18, wherein the substrate comprises a portion of a wafer, and wherein mounting the integrated circuit die onto the integrated circuit die mounting region of the substrate comprises a chip-on wafer (COW) process.

20. The method according to claim 19, wherein the substrate comprises a first substrate, further comprising providing a second substrate, further comprising coupling the packaged semiconductor device to the second substrate using a chip-on wafer-on-substrate (COWOS) process.

* * * * *